United States Patent

Lunn

[15] 3,641,450

[45] Feb. 8, 1972

[54] GAIN CONTROLLED DIFFERENTIAL AMPLIFIER CIRCUIT

[72] Inventor: Gerald K. Lunn, Scottsdale, Ariz.

[73] Assignee: Motorola, Inc., Franklin Park, Ill.

[22] Filed: Dec. 15, 1970

[21] Appl. No.: 98,279

[52] U.S. Cl. ....................330/30 D, 330/69, 330/29, 330/130

[51] Int. Cl. ....................H03f 3/68

[58] Field of Search ....................330/30 D, 69, 29, 130

[56] References Cited

UNITED STATES PATENTS 3,564,439 2/1971 Rao....................330/30 D 3,573,491 4/1971 Goss et al....................330/69 X

*Primary Examiner*—Nathan Kaufman

*Attorney*—Mueller & Aichele

[57] ABSTRACT

A two-stage monolithic differential amplifier circuit employs electronic gain control of both of the stages in order to improve the signal-to-noise ratio of the circuit and to reduce signal distortion and cross-modulation at high-signal levels. The input differential stage operates with current-division gain control. The output signals of the input stage are applied to the second or output differential amplifier stage, in which the transistors each have emitter resistors connected to a common terminal. The emitter resistors each are shunted by the collector-emitter path of a shunt transistor which is rendered nonconductive for maximum gain reduction of the output stage and which is saturated for minimum gain reduction of the output stage. The DC level of the output stage is maintained substantially constant throughout the AC gain control range.

11 Claims, 2 Drawing Figures

INVENTOR.
GERALD K. LUNN
BY Mueller & Aichele
ATTORNEYS.

PATENTED FEB 8 1972

3,641,450

INVENTOR.
GERALD K. LUNN
BY Mueller & Aichele
ATTORNEYS.

GAIN CONTROLLED DIFFERENTIAL AMPLIFIER CIRCUIT

BACKGROUND OF THE INVENTION

The use of monolithic integrated circuits for the RF and IF amplifier portions of television receivers and the like has resulted in the necessity of developing gain control which is capable of operation over a wide range from the automatic gain control feedback circuits commonly found in television receivers or similar circuits. Gain control for a monolithic differential integrated RF or IF amplifier circuit has been accomplished by employing a first differential amplifier as an input stage and applying the outputs of the first differential amplifier, respectively, to the junctions of the emitters of the transistors of two more differential amplifiers. Corresponding ones of the two transistors of each of these two additional differential amplifiers constitute the output transistors for the first gain controlled stage, with the other two transistors being utilized as current shunts. Gain control is obtained by varying the relative conductivity of the two transistors in each of the additional differential amplifiers to cause a current division of the input signals applied to the emitters of these transistors. Maximum gain is obtained by diverting all of the current through the output transistors. Minimum gain is obtained by causing the output transistors to have a minimum conductivity and the shunt transistors to have a maximum conductivity, thereby shunting most of the input signal through the shunt transistors.

Although a current-division gain-controlled differential amplifier stage operates satisfactorily to provide good gain control at low-signal levels, such a circuit suffers from a reduction of signal handling capability which is directly proportional to gain. Thus, at high-signal levels, the signal-to-noise ratio of the circuit may be unsatisfactory for some applications.

Another proposal for effecting gain control of an integrated circuit differential amplifier stage is to utilize back-to-back coupled diodes for emitter degeneration of the differential stage. A variable bias is applied to the junction of the diodes to vary the effective impedance presented by the diodes to the emitters of the amplifier. At high-signal levels, however, such a circuit has been found to produce cross-modulation products of a magnitude which are intolerable for many applications, particularly in the RF and IF stages of a television receiver.

It is desirable to provide a gain-controlled monolithic differential amplifier which is capable of operating with low distortion at high frequencies and high-signal levels while having minimum complexity.

SUMMARY OF THE INVENTION

Accordingly, it is an object of this invention to provide an improved gain-controlled differential amplifier.

It is a further object of this invention to provide a low-distortion gain-controlled differential amplifier.

It is an additional object of this invention to control the gain of a differential amplifier without affecting its DC operating level.

It is yet another object of this invention to provide a gain controlled differential amplifier circuit employing a minimum number of components.

In accordance with a preferred embodiment of this invention, a gain-controlled transistor differential amplifier circuit has the emitters of each of the transistors of the differential amplifier connected through corresponding emitter resistances to a first junction. This junction in turn is connected through a current source to a point of reference potential with operating potential being coupled to the collectors of the differential transistors. Input signals are applied to the bases of the transistors, and gain control is effected by varying the emitter resistances to vary the emitter degeneration of the amplifier.

In a more specific embodiment of the invention, the variation of the emitter resistance is accomplished through an additional pair of shunt transistors, the collector-emitter paths of which are connected between the emitters of the differential amplifier transistors and the junction, respectively. These additional transistors are operated between cutoff and saturation to provide the minimum and maximum gain obtainable from the amplifier. The conductivity of the additional shunt transistors is controlled by a gain control transistor having a gain control voltage applied to the base thereof. The collector of the gain control transistor is coupled to a source of operating potential and to the bases of the shunt transistors. The emitter of the gain control transistor is connected in common with the emitter of the current source transistor through a common emitter resistor to a point of reference potential; so that as the conductivity of the gain control transistor varies to vary the conductivity of the shunt transistors, the current through the common emitter resistor remains substantially constant. Variations in the current flowing through the base-emitter paths of the shunt transistors cause the DC current flow through the differential amplifier transistors to remain relatively constant throughout the gain control range.

DETAILED DESCRIPTION

Figure 1:
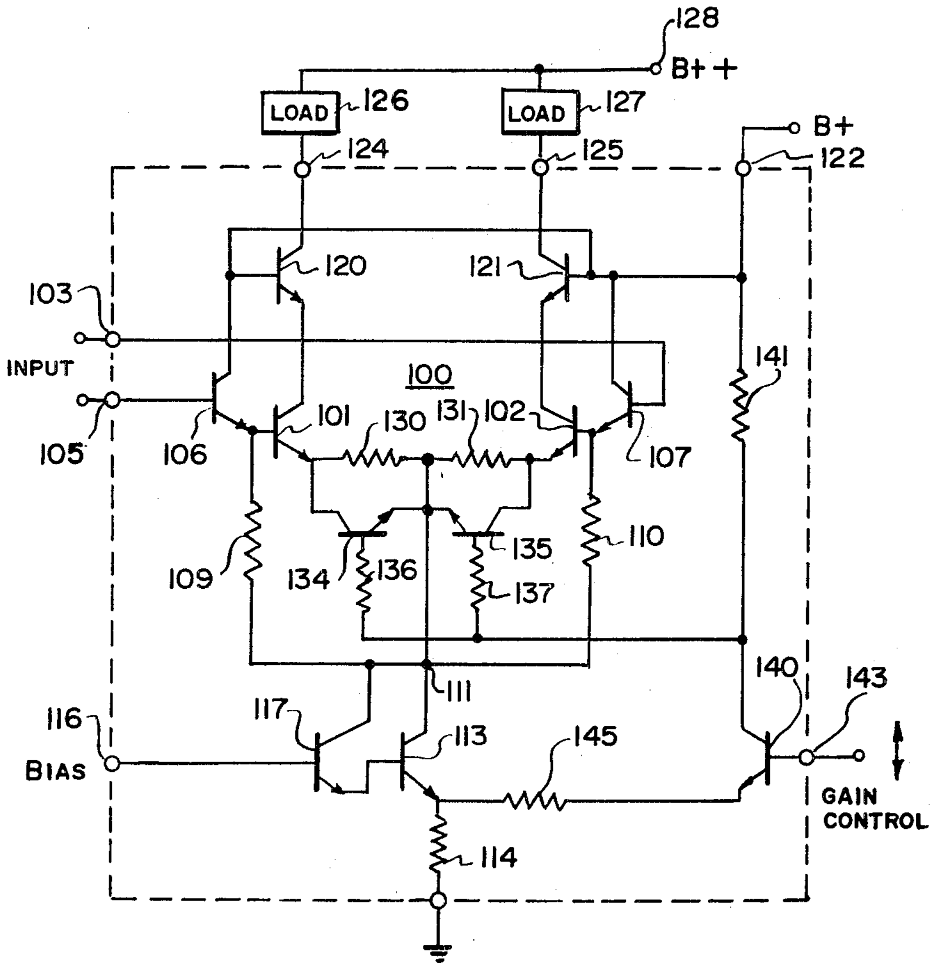
FIG. 1 is a schematic diagram of a gain-controlled differential amplifier according to a preferred embodiment of the invention.

Referring now to the drawings, wherein like reference numerals are used in both Figures to designate the same or similar components, there is shown in FIG. 1 a monolithic integrated circuit differential output amplifier stage employing automatic gain control in response to a varying gain control voltage.

The amplifier stage of FIG. 1 includes a differential amplifier 100 consisting of a pair of NPN-transistors 101 and 102 which are the output amplifier transistors of the amplifier stage. Input signals for the transistors 101 and 102 are applied differentially, i.e., 180° out-of-phase with respect to one another, to a pair of input bonding pads or terminals 103 and 105. These input signals, as applied to the terminals 103 and 105, are coupled to the bases of the transistors 101 and 102 through emitter-follower buffer transistors 106 and 107, respectively.

A pair of emitter resistors 109 and 110 connect the emitters of the transistors 106 and 107 to a common junction 111, which in turn is coupled to the collector of an NPN-current source transistor 113, the emitter of which is coupled through an emitter resistor 114 to ground. The current source transistor 113 has its conductivity controlled by a direct current bias potential applied to a terminal 116, which is connected to the base of an additional NPN-transistor 117 cascaded to the transistor 113 in a Darlington amplifier configuration. The Darlington circuit is utilized to provide impedance isolation, and if this isolation were not desired, the transistor 117 could be eliminated.

Output signals from the differential amplifier 100 are obtained through a pair of cascode-connected output NPN-transistors 120 and 121, the emitters of which are connected to the collectors of the transistors 101 and 102, respectively. The bases of the cascode-connected output transistors 120 and 121 and the collectors of the emitter-follower buffer transistors 106 and 107 all are connected in common to a source of B+ supply potential applied to a bonding pad 122. Output signals from the amplifier are obtained from the collectors of the transistors 120 and 121, which are connected to output bonding pads 124 and 125, respectively, to provide differential or opposite-phase output signals to loads 126 and 127. A higher source of positive DC potential B++ is coupled to a bonding pad 128 and through the load circuits 126 and 127 to the collectors of the cascode-connected transistors 120 and 121 to provide operating potential for the collectors of the transistors 101 and 102 in the differential amplifier circuit 100.

In order to control the gain of the differential amplifier stage 100, the emitters of the transistors 101 and 102 are connected through emitter degeneration resistors 130 and 131, respectively, to the junction 111 with the collector of the current source transistor 113. To obtain balanced fully differential gain control for the amplifier 100, the resistors 130 and 131 are matched in value and in characteristics; so that variations in temperature and the DC supply potential affect both resistors equally.

To provide a variable gain control for the amplifier circuit 100, an additional pair of NPN-shunt transistors 134 and 135 are connected with the collector-emitter paths thereof in shunt across the resistors 130 and 131, respectively. The collectors of the transistors 134 and 135 are connected to the emitters of the transistors 101 and 102, respectively, and the emitters of the transistors 134 and 135 are connected in common to the junction 111. By controlling the conductivity of the transistors 134 and 135, the shunting of the resistors 130 and 131 is varied to vary the emitter resistances of the transistors 101 and 102. This control is effected by connecting the bases of the transistors 134 and 135 through suitable coupling resistors 136 and 137 to the collector of a control transistor 140 which also is connected through a resistance 141 to the bonding pad 122 to which the B+ supply potential is applied.

A variable DC gain control potential is applied to the base of the transistor 140 at a gain control input terminal 143, and the emitter of the transistor 140 is connected through a resistor 145 to the junction of the emitter of the transistor 113 with the resistor 114. With this connection, the transistors 113 and 140 share a common emitter resistor 114, so that all of the current flowing through the transistors 113 and 140 also flows in common through the resistor 114.

When the gain control voltage is high or relatively positive at some maximum value, the transistor 140 is rendered heavily conductive. This causes the potential on the collector of the transistor 140 to be relatively low; and the parameters of the circuit are selected so that with this low potential appearing on the collector of the transistor 140, the transistors 134 and 135 are biased to nonconduction or cutoff. In this state of operation, the transistors 134 and 135 have virtually no affect on the impedance of the emitter resistors 130 and 131. As a consequence, the full resistances of the resistors 130 and 131 appear in the emitter circuits of the transistors 101 and 102; and the amplifier circuit 100 operates with minimum gain or maximum gain reduction due to the maximum emitter degeneration which is present.

With the transistor 140 operating at maximum conduction, a predetermined maximum current flows through the transistor 140 and the resistor 145 to join the current flowing through the current source transistor 113 to form the composite current flowing through the emitter resistor 114. The current flowing through the transistor 140 and the resistor 145 therefore reduces to some extent the current flowing through the transistor 113. From an examination of FIG. 1, it is apparent that the current flowing through the current source transistor 113 constitutes the current which establishes the DC level of operation of the transistors 101 and 102 in the amplifier circuit 100.

Now assume that the gain control voltage applied to the terminal 143 is reduced or becomes more negative to the point that the transistor 140 is cut off or rendered nonconductive. When this occurs, the potential on the collector of the transistor 140 rises to a high-positive value, forward-biasing the transistors 134 and 135 into conduction. The parameters of the circuit are chosen such that in this state of operation, the transistors 134 and 135 are driven to saturation; so that most of the current which previously flowed through the transistor 140 when it was fully conductive now is is diverted to the bases of the transistors 134 and 135. This current then flows through the base-emitter junctions or paths of these transistors to the junction 111 to joint the current flowing through the transistor 113 and the resistor 114 to ground. Since no current flows through the transistor 140 at this time, however, the current drawn by the transistor 113 is increased by an amount substantially equal to the amount of current previously flo!ing through the transistor 140. This additional increased current is supplied through the base-emitter paths of the transistors 134 and 135 to the junction 111, so that the DC current flowing through the signal transistors 101 and 102 remains nearly constant with the change in the current flowing through the transistors 113 and 140. With the transistors 134 and 135 saturated, a minimum resistance appears between the junction 111 and the emitters of the transistors 101 and 102. Thus, maximum gain or minimum gain reduction of the amplifier 100 occurs.

At intermediate levels of conduction of the transistor 140, with some current flowing through the transistor 140 and with the transistor 134 and 135 being rendered conductive at a level of conduction somewhere between cutoff and saturation, the current source transistor 113 is conducting at a level of current which is between its minimum conduction, when all of the current flows through the transistor 140 and no current flows through the base-emitter paths of the transistors 134 and 135, and the point of maximum gain reduction which is reached when the transistor 140 is fully cut off. The additional intermediate current drawn by the current source transistor 113, however, is supplied through the base-emitter paths of the transistors 134 and 135; so that the DC current drawn by the signal output transistors 101 and 102 remains relatively constant throughout the operating gain control range of the circuit.

Even though the direct current level of operation of the amplifier circuit 100 is maintained relatively constant with changes in the gain control voltage applied to the terminal 143, the degenerative resistive impedance coupled to the emitters of the transistors 101 and 102 varies over a relatively wide range, from a maximum provided by the resistors 130 and 131, with the transistors 134 and 135 nonconductive, to a minimum with the transistors 134 and 135 conducting at saturation. In this latter state of operation, the resistors 130 and 131 are essentially short-circuited; so that the differential amplifier 100 provides a maximum gain for AC signals applied to the input terminals 103 and 105. The cascode output transistors 120 and 121 insure that the output impedance of the circuit remains constant throughout the gain control range.

Figure 2:
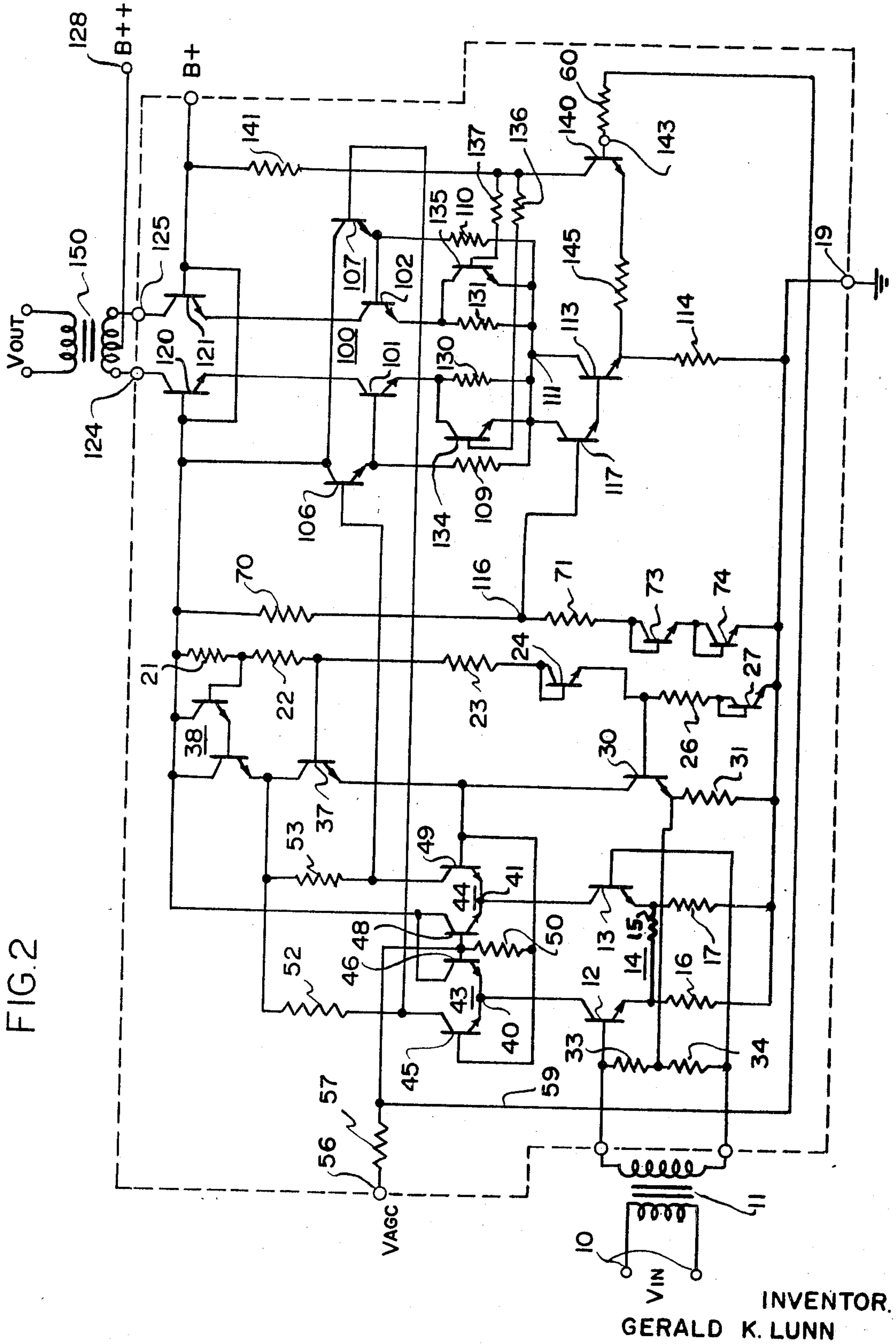
FIG. 2 is a schematic diagram of a multistage differential amplifier circuit incorporating the circuit shown in FIG. 1.

Referring now to FIG. 2, there is shown a two-stage, monolithic, integrated, gain-controlled, differential amplifier circuit, utilizing as an output stage the circuit shown in FIG. 1 and including an additional gain controlled input stage. The circuit shown in FIG. 2 may be fabricated as a single monolithic integrated circuit chip and may be used, for example, as the IF amplifier stages of a television receiver or the like. Input signals, the gain of which is to be controlled, are applied to a pair of input terminals 10 connected across the primary winding of a transformer 11. These input signals may be obtained from the output of a mixer stage of a television receiver and constitute the intermediate frequency (IF) signals which are to be applied to the two-stage IF amplifier shown in FIG. 2. The secondary winding of the transformer 11 has opposite ends connected to the bases of pair of input transistors 12 and 13, which are connected as part of an input differential circuit 14. The emitters of the transistors 12 and 13 are coupled through suitable emitter resistors 16 and 17 to ground bonding pad 19 and to each other through an emitter resistor 15 which defines the gain of the differential amplifier. To provide a DC operating bias potential for the transistors 12 and 13 of the differential amplifier 14, a voltage divider including resistors 21, 22, 23, a transistor diode 24, a resistor 26, and another transistor diode 27 is connected in series between the bonding pad 122, to which the B+ supply potential is applied, and the grounded bonding pad 19. The junction between the diode 24 and the resistor 26 is connected to the base of a reference transistor 30, the emitter of which is coupled through an emitter resistor 31 to the bonding pad 19. The emitter of the transistor 30 also is connected to the junction between a pair of equal resistors 33 and 34, the other ends of which are connected respectively to the bases of the transistors 12 and 13 to provide the DC operating bias levels at the bases of the input transistors 12 and 13.

The bias network includes a further reference transistor 37, the base of which is connected to the junction of the resistors 22 and 23, and a Darlington amplifier circuit 38, with the base of the input transistor of the Darlington circuit 38 connected to the junction of the resistors 21 and 22. The collector-emitter paths of the output transistor of the Darlington circuit 38, the transistor 37, and the transistor 30 all are connected in series, with the emitters of these transistors supplying DC operating potentials at different levels to the input stage of the amplifier circuit shown in FIG. 2.

As is well known, the transistor diodes 24 and 27 provide temperature compensation for the input differential amplifier stage as well as establishing the operating DC levels utilized in the circuit.

To provide gain control for the input stage including the differential amplifier 14, the output signals present on the collectors of the transistors 12 and 13 are connected, respectively, to output nodes 40 and 41, which constitute the common emitter nodes of a pair of gain-controlled differential amplifier circuits 43 and 44, respectively. The differential amplifier circuit 43 includes a pair of NPN-transistors 45 and 46, the emitters of which are connected to the node 40. Similarly, the differential amplifier circuit 44 includes a pair of NPN-transistors 48 and 49, the emitters of which are connected to the node 41.

DC operating potential for the bases of the transistors 45, 46, 48 and 49 is obtained from the emitter of the transistor 37 and is applied directly to the bases of the transistors 45 and 49 and through an isolating resistor 50 to the bases of the transistors 46 and 48. The collectors of the transistors 45 and 49 are connected through respective load resistors 52 and 53 to the emitter of the output transistor of the Darlington circuit 38, and the collectors of the transistors 45 and 49 also are connected, respectively, to the bases of the transistors 107 and 106 constituting the emitter-follower input transistors of the output stage, previously described in conjunction with FIG. 1.

The Darlington circuit 38 serves to bias the collectors of transistors 45 and 49 to prevent these collectors from rising to the value of the B+ supply voltage applied to the bonding pad 122 when the transistors 45 and 49 are completely turned off by AGC action. If the collectors of these transistors were allowed to rise to the value of the B+ supply voltage, undesired saturation in the output differential amplifier 100 could be caused.

The collectors of the transistors 46 and 48 are coupled together directly to the bonding pad 122, with the transistors 46 and 48 operating as part of a current-division gain-control circuit. Current shunted through the transistors 46 and 48 reduces the current flowing through the output or load transistors 45 and 49 of the differential amplifier circuits 43 and 44. The gain control voltage when the circuit is used at the IF amplifier strip for a television receiver may constitute the AGC voltage of the television receiver. This varying DC AGC voltage is applied to an input bonding pad 56 and through a coupling resistor 57 to the junction of the bases of the transistors 46 and 48. The gain control voltage also is applied over a lead 59 and through a second coupling resistor 60 to the terminal 143 at the base of the gain control transistor 140 operating to control the gain of the output stage previously described in conjunction with FIG. 1.

When the amplifier circuit shown in FIG. 2 is to be operated with maximum AC gain, the gain control voltage applied to the terminal 56 is at a low or minimum value such that the transistors 46 and 48 are biased to nonconduction, as is the transistor 140, due to the relatively negative potential applied to the bases of these NPN-transistors. In this condition of operation, the signals appearing on the collectors of the transistors 12 and 13 of the input differential stage 14 are applied substantially attenuated (maximum gain) through the transistors 45 and 49, and from the collectors of the transistors 45 and 49 to the bases of the transistors 107 and 106 to constitute the input signals for the output differential amplifier stage 100. As stated previously, with the transistor 140 rendered nonconductive, the shunt transistors 134 and 135 in the output stage are rendered fully conductive at saturation so that maximum AC gain of the output stage is obtained.

As the gain control voltage applied to the terminal 56 rises toward a more positive value, the transistors 46 and 48 are rendered increasingly conductive, which causes a corresponding decreasing conductivity of the transistors 45 and 49. As a consequence, an increasing amount of the output signal present on the collectors of the transistors 12 and 13 of the input differential amplifier stage is shunted through the transistors 46 and 48, and a lesser amount of this signal is applied through the transistors 45 and 49. This results in a reduced signal level applied to the bases of the emitter-follower transistors 107 and 106 of the output differential amplifier stage. At the same time, the conductivity of the transistor 140 in the output stage is increased, causing a corresponding decrease in the conductivity of the shunt transistors 134 and 135. This increases the emitter degeneration resistance coupled to the emitters of the transistors 101 and 102 in the output differential output stage 100. Thus, a gain reduction is simultaneously effected in both the input and output stages of the differential amplifier.

When a maximum automatic gain control voltage is applied to the terminal 56 in the form of a maximum positive potential, the transistors 46 and 48 are driven to maximum conductivity with the signal output transistors 45 and 49 being driven to a point of minimum conductivity. At the same time, the transistor 140, providing the gain control for the output stage of the amplifier, is rendered fully conductive and the shunt transistors 134 and 135 are rendered fully nonconductive. This is the point of minimum gain or maximum gain reduction in the operation in the amplifier circuit shown in FIG. 2.

The parameters of the circuit are chosen so that for a relatively wide variation in the gain control effected by the input stage including the differential amplifiers 14, 43 and 44, the output stage operates with the transistor 140 being nonconductive through most of the first portion of the increasing gain control voltage from a minimum value toward a more positive value. Then additional increases of the gain control voltage applied to the bonding pad 56 rapidly drive the transistor 140 from a point of nonconduction to a point of full conduction, so that the gain control of the output stage including the differential amplifier 100 is switched from a point of maximum gain to a point of minimum gain over a relatively range (of the order of 15 db.) of the total gain control range (of the order of 40 db.) applied to the terminal 56. Gain control of the input stage 14, 43 and 44 varies more gradually over a wider range of input AGC voltages.

By employing gain control of both the input and output stages of the amplifier circuit, the signal-to-noise ratio of the composite circuit is substantially improved over circuits which employ current division gain control of the input stage of the amplifier only. In addition, signal distortion and cross-modulation is lower at high-signal levels than in circuits not utilizing the two-stage gain control shown in FIG. 2.

It should be noted that the operating bias potential for the base of the transistor 117 in the output stage is obtained from a second voltage divider including a pair of resistors 70 and 71 connected in series with two transistor diodes 73 and 74 between the bonding pads 122 and 19. The junction between the resistors 70 and 71 is connected to the base of the transistor 117; and in addition to providing operating potential for the transistors 117 and 113, the diodes 73 and 74 provide temperature compensation for the base-emitter junctions of the transistors 117 and 113 in a manner which is well known.

By utilizing the gain control described in conjunction with FIG. 1 and shown with the output stage of two-stage amplifier of FIG. 2, no compromise of performance factors, such as distortion, cross-modulation, frequency response, output impedance, and output signal handling, has been necessary. The output stage operates at a constant DC current level throughout the range of AC gain control for this stage.

In the circuit shown in FIG. 2, the output bonding pads 124 and 125 are illustrated as coupled to the end points of the primary winding of an output transformer 150, the secondary winding of which then may be coupled to additional stages in the circuit with which the IF amplifier shown in FIG. 2 is used. It should be apparent that, in place of the input transformer 11 and output transformer 150 shown in FIG. 2, direct coupling of the amplifier input and output signals with additional stages of the receiver also may be employed if so desired. The input and output connections by way of the transformers 11 and 150 are shown merely for purposes of illustration.

I claim:

1. A gain-controlled differential amplifier circuit including in combination:

first and second transistors, each having a base, collector and emitter;

first and second voltage supply terminals adapted for connection across a source of direct current voltage;

first circuit means coupling the collectors of said first and second transistors with said first voltage supply terminal;

means for applying input signals to the bases of said transistors;

first and second variable impedance means coupled together at a first junction and connected in series between the emitters of said first and second transistors;

second circuit means coupling said first junction with said second voltage supply terminal;

means for supplying a gain control voltage; and means for varying the impedance of the first and second variable impedance means in response to said gain control voltage.

2. The combination according to claim 1 wherein said first and second variable impedance means have the same impedance and said means for varying the impedance of said first and second variable impedance means causes said impedance of both of said impedance means to be varied in the same amount simultaneously.

3. The combination according to claim 1 wherein said second circuit means comprises: a current source including a third transistor, having a base, collector and emitter, the collector of said third transistor being connected with said junction, the emitter of said third transistor being connected in circuit with said second voltage supply terminal; and the base of said third transistor being coupled with a source of biasing potential.

4. The combination according to claim 3 wherein said first circuit means includes fourth and fifth transistors, connected in cascode circuits respectively, between the collectors of said first and second transistors and said first voltage supply terminal.

5. A gain-controlled differential amplifier circuit including in combination:

first and second voltage supply terminals adapted for connection across a source of operating potential;

first and second transistors, each having a collector, base and emitter;

first circuit means connecting the collectors of said first and second transistors with said first voltage supply terminal;

means for applying input signals to the bases of said first and second transistors;

first and second resistance means coupled together at a first junction and connected in series between the emitter of said first and second transistors;

third and fourth transistors, each having a collector base and emitter, with the collector-emitter path of said third transistor connected in parallel with said first resistance means, and the collector-emitter path of said fourth transistor connected in parallel with said second resistance means;

control circuit means coupled with the bases of said third and fourth transistors for varying the conductivity thereof in response to a gain control voltage;

means for supplying a gain control voltage to said control circuit means; and current source means coupling said first junction with said second voltage supply terminal.

6. The combination according to claim 5 wherein the collector of said third transistor is connected to the emitter of said first transistor, the collector of said fourth transistor is connected to the emitter of said second transistor, the emitters of the third and fourth transistors are connected together at said first junction, and the bases of said third and fourth transistors are coupled with the output of said control circuit means, with said third and fourth transistors being driven between cutoff and saturation by the output of said control circuit means.

7. The combination according to claim 6 wherein said current source means includes third resistance means and a first current source transistor, having a base, collector and emitter, wit the collector of said first current source transistor being connected to said first junction and the emitter of said first current source transistor being connected through said third resistance means to said second voltage supply terminal, the combination further including means for supplying an operating potential to the base of said first current source transistor.

8. The combination according to claim 7 further including fourth resistance means, wherein said control circuit means includes a second current source transistor, having a collector, base, and emitter, the collector thereof being coupled through said fourth resistance means to a voltage supply terminal, the collector of said second current source transistor also being coupled in circuit with the bases of said third and fourth transistors, the emitter electrode of said second current source transistor being coupled in circuit with the emitter electrode of said first current source transistor, and the base electrode of said second current source transistor being coupled with said means for supplying gain control voltage, thereby causing the conductivity of said second current source transistor to vary in accordance with said gain control voltage.

9. The combination according to claim 8 wherein said first circuit means includes fifth and sixth transistors, each having a base, collector and emitter, the collector-emitter path of said fifth transistor connected in cascode circuit between the collector of said first transistor and said first voltage supply terminal, the collector-emitter path of said sixth transistor connected in cascode circuit between the collector of said second transistor and said first voltage supply terminal and means for providing a bias potential to the bases of said fifth and sixth transistors.

10. The combination according to claim 8 further including coupling resistance means and wherein the emitter of said first current source transistor is connected with said third resistance means at a third junction and the emitter of the second current source transistor is connected through said coupling resistance means to said third junction.

11. The combination according to claim 10 wherein all of said transistors are of the same conductivity type.

* * * * *